United States Patent
Li

(10) Patent No.: US 9,225,166 B2
(45) Date of Patent: Dec. 29, 2015

(54) ELECTRO-STATIC DISCHARGE PROTECTIVE CIRCUIT AND DISPLAY SUBSTRATE AND DISPLAY DEVICE HAVING THE SAME

(71) Applicant: BOE Technology Group Co., Ltd., Beijing (CN)

(72) Inventor: Yongqian Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 61 days.

(21) Appl. No.: 14/310,371

(22) Filed: Jun. 20, 2014

(65) Prior Publication Data

US 2015/0303686 A1   Oct. 22, 2015

(30) Foreign Application Priority Data

Apr. 21, 2014   (CN) .......................... 2014 1 0160230

(51) Int. Cl.
| | |
|---|---|
| *H01L 29/10* | (2006.01) |
| *H01L 29/76* | (2006.01) |
| *H01L 31/036* | (2006.01) |
| *H01L 31/112* | (2006.01) |
| *H02H 9/04* | (2006.01) |
| *H02H 7/20* | (2006.01) |
| *H01L 27/02* | (2006.01) |

(52) U.S. Cl.
CPC ........... *H02H 9/044* (2013.01); *H01L 27/0251* (2013.01); *H02H 7/20* (2013.01)

(58) Field of Classification Search
CPC ... H02H 9/045; H01L 27/0296; H01L 27/124
USPC ......................................................... 257/59
See application file for complete search history.

(56) References Cited

U.S. PATENT DOCUMENTS

| | | | | |
|---|---|---|---|---|
| 5,650,636 | A * | 7/1997 | Takemura | ........... G02F 1/13624 257/532 |
| 7,420,251 | B2 * | 9/2008 | Chen | ................... H01L 27/0285 257/355 |
| 8,941,958 | B2 * | 1/2015 | Tomatsu | ............. H01L 27/0266 361/56 |
| 9,130,367 | B2 * | 9/2015 | Yamazaki | ............... H02H 9/044 |
| 2010/0110113 | A1 * | 5/2010 | Kimura | ................ G09G 3/2014 345/690 |
| 2015/0048320 | A1 * | 2/2015 | Lee | ..................... H01L 27/1255 257/40 |
| 2015/0053953 | A1 * | 2/2015 | Ebisuno | ............... G09G 3/3233 257/40 |

* cited by examiner

*Primary Examiner* — Dharti Patel
(74) *Attorney, Agent, or Firm* — Westman, Champlin & Koehler, P.A.

(57) ABSTRACT

The present invention relates to display technology. It discloses an electro-static discharge protective circuit comprising: a first thin film transistor having a first source electrode connected to a first reference level end, and a first gate electrode and a first drain electrode connected with each other at a first node; a second thin film transistor having a second source electrode connected to said first node, and a second gate electrode and a second drain electrode connected with each other at a discharge end; a third thin film transistor having a third source electrode connected to said discharge end, and a third gate electrode and a third drain electrode connected with each other at a second node, wherein said second node is connected with said first node; and a fourth thin film transistor having a fourth source electrode connected at said second node, and a fourth gate electrode and a fourth drain electrode connected to a second reference level end. The electro-static discharge protective circuit according to the present invention can reduce a risk of circuit breakdown and failure. Correspondingly, the present invention also discloses a display substrate and a display device having the abovementioned electro-static discharge protective circuit.

14 Claims, 3 Drawing Sheets

ELECTRO-STATIC DISCHARGE PROTECTIVE CIRCUIT AND DISPLAY SUBSTRATE AND DISPLAY DEVICE HAVING THE SAME

CROSS-REFERENCE TO RELATED APPLICATION

This application claims the benefit of Chinese Patent Application No. 201410160230.4 filed on Apr. 21, 2014 in the State Intellectual Property Office of China, the whole disclosure of which is incorporated herein by reference.

BACKGROUND OF THE INVENTION

1. Field of the invention

The present invention relates to display technology, and more particularly, to an electro-static discharge protective circuit and a display substrate and a display device having the same.

2. Description of the Related Art

Electro-Static Discharge (ESD) protective circuit is an important part of a liquid crystal display device and of an organic luminescence display device. Such protective circuit is capable of protecting the display device from electrostatic damage during production, transportation and operation. FIG. 1 shows configuration of an electro-static discharge protective circuit in the prior art. This protective circuit comprises four thin film transistors M1, M2, M3 and M4. When the signal line S works normally to perform signal transmission, all the four thin film transistors M1, M2, M3 and M4 turn off so that the protective circuit does not perform a protection function. When there are positive electrical charges accumulated on the signal line S, the thin film transistors M1 and M2 turn on and the accumulated electrical charges are discharged from the signal line S to the high level end VGH, thereby achieving the electro-static discharge. When there are negative electrical charges accumulated on the signal line S, the thin film transistors M3 and M4 turn on and the accumulated electrical charges are discharged from the signal line S to the low level end VGL, thereby achieving the electro-static discharge.

The abovementioned ESD protective circuit is capable of protecting the display device from electrostatic damage in certain degrees, however, when there is a great amount of electrical charges accumulated on the signal line S, there is still a high risk that the circuit connected with the signal line S is breakdown and fails.

SUMMARY OF THE INVENTION

In view of the above, at least one object of the present invention is to provide an electro-static discharge protective circuit, which can reduce a risk of circuit breakdown and failure.

Another object of the present invention is to provide a display substrate having an electro-static discharge protective circuit, which can reduce a risk of circuit breakdown and failure.

Still another object of the present invention is to provide a display device having an electro-static discharge protective circuit, which can reduce a risk of circuit breakdown and failure.

According to one aspect of the present invention, there is provided an electro-static discharge protective circuit, comprising:

a first thin film transistor having a first source electrode connected to a first reference level end, and a first gate electrode and a first drain electrode connected with each other at a first node;

a second thin film transistor having a second source electrode connected to the first node, and a second gate electrode and a second drain electrode connected with each other at a discharge end;

a third thin film transistor having a third source electrode connected to the discharge end, and a third gate electrode and a third drain electrode connected with each other at a second node, wherein the second node is connected with the first node; and a fourth thin film transistor having a fourth source electrode connected to the second node, and a fourth gate electrode and a fourth drain electrode connected to a second reference level end.

According to another aspect of the present invention, there is provided an electro-static discharge protective circuit, comprising:

a first thin film transistor having a first source electrode connected to a first reference level end, and a first gate electrode and a first drain electrode connected with each other at a first node;

a second thin film transistor having a second source electrode connected to the first node, and a second gate electrode and a second drain electrode connected with each other at a discharge end;

a third thin film transistor having a third source electrode connected to the discharge end, and a third gate electrode and a third drain electrode connected with each other at a second node;

a capacitor having a first end connected to the first node and a second end connected to the second node; and a fourth thin film transistor having a fourth source electrode connected to the second node, and a fourth gate electrode and a fourth drain electrode connected to a second reference level end.

According to still another aspect of the present invention, there is provided a display substrate comprising the abovementioned electro-static discharge protective circuit, wherein the discharge end in the electro-static discharge protective circuit is connected to a signal line in the display substrate.

According to yet another aspect of the present invention, there is provided a display device comprising the abovementioned display substrate.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
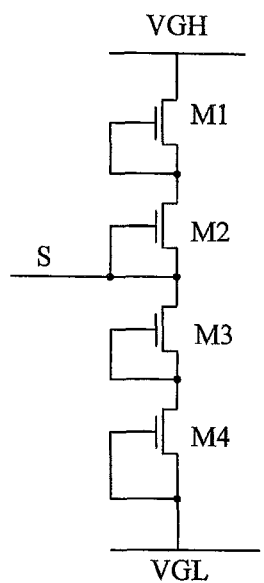
FIG. 1 is a schematic view of an electro-static discharge protective circuit in the prior art.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

According to a generally inventive concept of the present invention, there provides an electro-static discharge protective circuit, comprising: a first thin film transistor having a first source electrode connected to a first reference level end, and a first gate electrode and a first drain electrode connected with each other at a first node; a second thin film transistor having a second source electrode connected to the first node, and a second gate electrode and a second drain electrode connected with each other at a discharge end; a third thin film transistor having a third source electrode connected to the discharge end, and a third gate electrode and a third drain electrode connected with each other at a second node, wherein the second node is connected with the first node; and a fourth thin film transistor having a fourth source electrode connected to the second node, and a fourth gate electrode and a fourth drain electrode connected to a second reference level end. Alternatively, there provides an electro-static discharge protective circuit, comprising: a first thin film transistor having a first source electrode connected to a first reference level end, and a first gate electrode and a first drain electrode connected with each other at a first node; a second thin film transistor having a second source electrode connected to the first node, and a second gate electrode and a second drain electrode connected with each other at a discharge end; a third thin film transistor having a third source electrode connected to the discharge end, and a third gate electrode and a third drain electrode connected with each other at a second node; a capacitor having a first end connected to the first node and a second end connected to the second node; and a fourth thin film transistor having a fourth source electrode connected to the second node, and a fourth gate electrode and a fourth drain electrode connected to a second reference level end.

Figure 2:
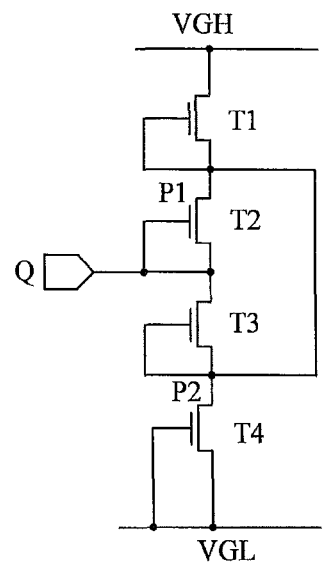
FIG. 2 is a schematic view of an electro-static discharge protective circuit according to an embodiment of the present invention.

Referring to FIG. 2, an electro-static discharge protective circuit is provided according to an embodiment of the present invention. The electro-static discharge protective circuit comprises a first thin film transistor T1 having a first source electrode connected to a first reference level end and a first gate electrode and a first drain electrode connected with each other at a first node P1; a second thin film transistor T2 having a second source electrode connected to the first node P1 and a second gate electrode and a second drain electrode connected with each other at a discharge end Q; a third thin film transistor T3 having a third source electrode connected to the discharge end Q and a third gate electrode and a third drain electrode connected with each other at a second node P2, wherein the second node P2 is connected with the first node P1; and a fourth thin film transistor T4 having a fourth source electrode connected to the second node P2, and a fourth gate electrode and a fourth drain electrode connected to a second reference level end.

Specifically, in an embodiment shown in FIG. 2, the abovementioned first to fourth thin film transistors are N-type thin film transistors, the abovementioned first reference level end is a high level end VGH, and, the abovementioned second reference level end is a low level end VGL. The abovementioned discharge end Q is configured to connected to a signal line. When the signal line works normally to perform signal transmission, the four thin film transistor turn off, here, the ESD protective circuit does not perform a protection function. When there are positive electrical charges accumulated on the discharge end Q, gate-to-source voltage across T2 goes beyond its threshold voltage such that T2 turns on, here, there is a high electrical potential at the first node P1, and, gate-to-source voltage across T1 goes beyond its threshold voltage such that T1 turns on, thereby, the accumulated positive electrical charges at the discharge end Q are discharged to the high level end VGH through the first thin film transistor T1 and the second thin film transistor T2. Meanwhile, since the first node P1 is connected with the second node P2, electrical potential at the second node P2 is the same as that at the first node P1 but is differed greatly from that at the low level end VGL, thereby, a reverse breakdown occurs at the fourth thin film transistor T4 and the accumulated positive electrical charges at the discharge end Q are discharged to the low level end VGL through the second thin film transistor T2 and the fourth thin film transistor T4. When there are negative electrical charges accumulated on the discharge end Q, gate-to-source voltage across T3 goes beyond its threshold voltage such that T3 turns on, here, there is a low electrical potential at the second node P2, and, gate-to-source voltage across T4 goes beyond its threshold voltage such that T4 turns on, thereby, the accumulated negative electrical charges at the discharge end Q can be discharged to the low level end VGL through the third thin film transistor T3 and the fourth thin film transistor T4. Meanwhile, since the second node P2 is connected with the first node P1, electrical potential at the first node P1 is the same as that at the second node P2 but is differed greatly from that at the high level end VGH, thereby, a reverse breakdown occurs at the first thin film transistor T1 and the accumulated negative electrical charges at the discharge end Q are discharged to the high level end VGH through the third thin film transistor T3 and the first thin film transistor T1.

Figure 3:
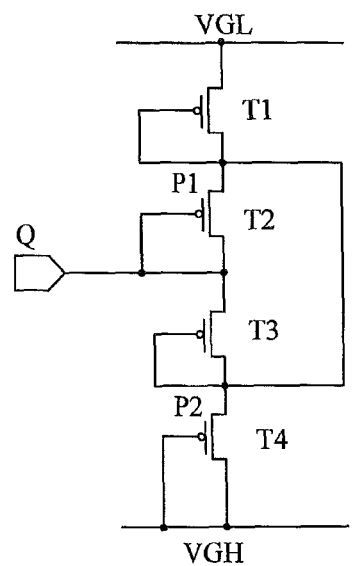
FIG. 3 is a schematic view of another electro-static discharge protective circuit according to an embodiment of the present invention.

Alternatively, in an embodiment shown in FIG. 3, the abovementioned first to fourth thin film transistors are P-type thin film transistors, the abovementioned first reference level end is a low level end VGL, and, the abovementioned second reference level end is a high level end VGH. Differences between the N-type thin film transistor and the P-type thin film transistor are that, the N-type thin film transistor has a positive threshold voltage, and, the N-type thin film transistor turns on when the gate-to-source voltage across the N-type thin film transistor is higher than the threshold voltage while the N-type thin film transistor turns off when the gate-to-source voltage across the N-type thin film transistor is lower than the threshold voltage; and, the P-type thin film transistor has a negative threshold voltage, and, the P-type thin film transistor turns on when the gate-to-source voltage across the P-type thin film transistor is lower than the threshold voltage while the P-type thin film transistor turns off when the gate-to-source voltage across the P-type thin film transistor is higher than the threshold voltage. In the ESD protective circuit shown in FIG. 3, when there are positive electrical charges accumulated on the discharge end Q, gate-to-source voltage across T3 is lower than its threshold voltage such that T3 turns on, here, there is a high electrical potential at the second node P2, and, gate-to-source voltage across T4 is lower than its threshold voltage such that T4 turns on, thereby, the accumulated positive electrical charges at the discharge end Q can be discharged to the high level end VGH through the third thin film transistor T3 and the fourth thin film transistor T4. Meanwhile, since the first node P1 is connected with the second node P2, electrical potential at the first node P1 is the same as that at the second node P2 but is differed greatly from that at the low level end VGL, thereby, a reverse breakdown occurs at the first thin film transistor T1 and the accumulated positive electrical charges at the discharge end Q can be discharged to the low level end VGL through the third thin film transistor T3 and the first thin film transistor T1. Similarly, when there are negative electrical charges accumulated on the discharge end Q, the negative electrical charges are discharged to the low level end VGL through T1 and T2, and, the negative electrical charges are discharged to the high level end VGH through T2 and the reversely breakdown T4.

Figure 4:
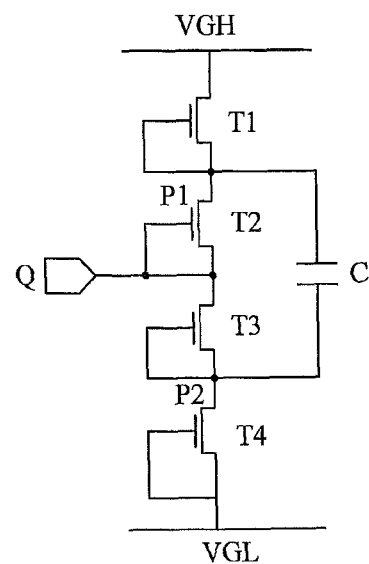
FIG. 4 is a schematic view of still another electro-static discharge protective circuit according to an embodiment of the present invention.

Referring to FIG. 4, an electro-static discharge protective circuit is further provided according to an embodiment of the present invention. This electro-static discharge protective circuit comprises a first thin film transistor T1 having a first source electrode connected to a first reference level end and a first gate electrode and a first drain electrode connected with each other at a first node P1; a second thin film transistor T2 having a second source electrode connected to the first node P1 and a second gate electrode and a second drain electrode connected with each other at a discharge end Q; a third thin film transistor T3 having a third source electrode connected to the discharge end Q and a third gate electrode and a third drain electrode connected with each other at a second node P2; a capacitor C having a first end connected to the first node P1 and a second end connected to the second node P2; and a fourth thin film transistor T4 having a fourth source electrode connected to the second node P2 and a fourth gate electrode and a fourth drain electrode connected to a second reference level end.

Specifically, in an embodiment shown in FIG. 4, the abovementioned first to fourth thin film transistors are N-type thin film transistors, the abovementioned first reference level end is a high level end VGH, and, the abovementioned second reference level end is a low level end VGL. The abovementioned discharge end Q is configured to connected to a signal line. When the signal line works normally to perform signal transmission, the four thin film transistor turn off, here, the ESD protective circuit does not perform a protection function. When there are positive electrical charges accumulated on the discharge end Q, gate-to-source voltage across T2 goes beyond its threshold voltage such that T2 turns on, here, there is a high electrical potential at the first node P1, and, gate-to-source voltage across T1 goes beyond its threshold voltage such that T1 turns on, thereby, the accumulated positive electrical charges at the discharge end Q are discharged to the high level end VGH through the first thin film transistor T1 and the second thin film transistor T2. Further, since the first node P1 and the second node P2 are connected respectively to both ends of the capacitor C, when the electrical potential at P1 goes up, the electrical potential at P2 goes up correspondingly due to bootstrap function of the capacitor C, accordingly, source-to-drain voltage across the fourth thin film transistor T4 goes up to extremity and a reverse breakdown occurs at the fourth thin film transistor T4, and, the electrical potential at P2 goes down, source-to-drain voltage across the third thin film transistor T3 goes up to extremity and a reverse breakdown occurs at the third thin film transistor T3, thereby, the accumulated positive electrical charges at the discharge end Q are discharged to the low level end VGL through the third thin film transistor T3 and the fourth thin film transistor T4. When there are negative electrical charges accumulated on the discharge end Q, gate-to-source voltage across T3 goes beyond its threshold voltage such that T3 turns on, here, there is an extremely low electrical potential at the second node P2, and, gate-to-source voltage across T4 goes beyond its threshold voltage such that T4 turns on, thereby, the accumulated negative electrical charges at the discharge end Q can be discharged to the low level end VGL through the third thin film transistor T3 and the fourth thin film transistor T4. Meanwhile, since the first node P1 and the second node P2 are connected respectively to both ends of the capacitor C, when the electrical potential at P2 goes down, the electrical potential at P1 goes down correspondingly due to bootstrap function of the capacitor C, accordingly, source-to-drain voltage across the first thin film transistor T1 goes up to extremity and a reverse breakdown occurs at the first thin film transistor T1, and, the electrical potential at P1 goes up, source-to-drain voltage across the second thin film transistor T2 goes up to extremity and a reverse breakdown occurs at the second thin film transistor T2, thereby, the accumulated negative electrical charges at the discharge end Q can be discharged to the high level end VGH through the first thin film transistor T1 and the second thin film transistor T2.

Figure 5:
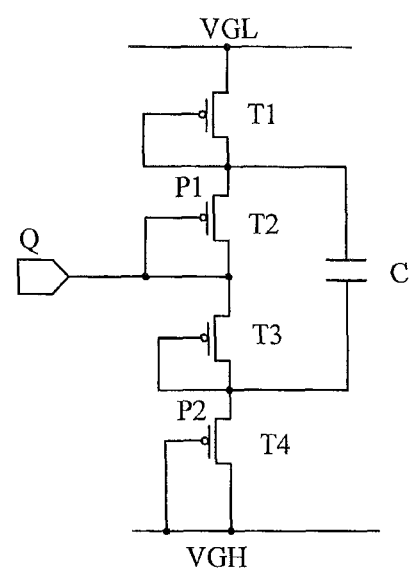
FIG. 5 is a schematic view of yet another electro-static discharge protective circuit according to an embodiment of the present invention.

Alternatively, in an embodiment shown in FIG. 5, the abovementioned first to fourth thin film transistors are P-type thin film transistors, the abovementioned first reference level end is a low level end VGL, and, the abovementioned second reference level end is a high level end VGH. Differences between the ESD protective circuit shown in FIG. 5 and the ESD protective circuit shown in FIG. 4 are that, the thin film transistors in the ESD protective circuit shown in FIG. 5 are P-type thin film transistors while the thin film transistors in the ESD protective circuit shown in FIG. 4 are N-type thin film transistors. When there are positive electrical charges accumulated on the discharge end Q, the accumulated positive electrical charges are discharged to the high level end VGH through the third thin film transistor T3 and the fourth thin film transistor T4, meanwhile, the accumulated positive electrical charges are discharged to the low level end VGL through the first thin film transistor T1 and the second thin film transistor T2. Similarly, when there are negative electrical charges accumulated on the discharge end Q, the negative electrical charges are discharged to the low level end VGL through the first thin film transistor T1 and the second thin film transistor T2, and, the negative electrical charges are discharged to the high level end VGH through the third thin film transistor T3 and the fourth thin film transistor T4.

It should be noted that, the abovementioned source electrodes and drain electrodes of the thin film transistors are interchangable.

In the electro-static discharge protective circuit according to the embodiments of the present invention, once there are too many electrical charges accumulated at the discharge end, the accumulated charges are discharged from the discharge end to one electrical level end while the thin film transistor connected to the other electrical level end is breakdown so as to provide a passage through which the accumulated charges are discharged from the discharge end to the other electrical level end, in this way, the accumulated charges at the discharge end are discharged simultaneously to the two electrical level ends. Therefore, it achieves a rapider electrical discharging once there accumulates too many electrical charges, such that the risk of breakdown and failure of the circuit connected to the discharge end is reduced.

Further, the embodiments of the present invention further provides a display substrate comprising the abovementioned electro-static discharge protective circuit, wherein the discharge end of the electro-static discharge protective circuit is connected to a signal line in said display substrate. Specifically, this signal line may be embodied as data line or gate line.

Furthermore, the embodiments of the present invention further provides a display device comprising the abovementioned display substrate.

This display device comprises but not limited to any products or parts having a display function, such as liquid crystal panel, electronic paper, OLED panel, mobile phone, tablet computer, TV, display, notebook computer, digital photo frame, GPS, etc.

Correspondingly, in the display substrate and the display device according to the embodiments of the present invention, once there are too many electrical charges accumulated at the discharge end of the electro-static discharge protective circuit, the accumulated charges are discharged from the discharge end to one electrical level end while the thin film transistor connected to the other electrical level end is breakdown so as to provide a passage through which the accumulated charges are discharged from the discharge end to the other electrical level end, in this way, the accumulated charges at the discharge end are discharged simultaneously to the two electrical level ends. Therefore, it achieves a rapider electrical discharging once there accumulates too many electrical charges, such that the risk of breakdown and failure of the circuit connected to the discharge end is reduced.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An electro-static discharge protective circuit, comprising:
   a first thin film transistor having a first source electrode connected to a first reference level end, and a first gate electrode and a first drain electrode connected with each other at a first node;
   a second thin film transistor having a second source electrode connected to said first node, and a second gate electrode and a second drain electrode connected with each other at a discharge end;
   a third thin film transistor having a third source electrode connected to said discharge end, and a third gate electrode and a third drain electrode connected with each other at a second node, wherein said second node is connected with said first node; and
   a fourth thin film transistor having a fourth source electrode connected to said second node, and a fourth gate electrode and a fourth drain electrode connected to a second reference level end.

2. The electro-static discharge protective circuit according to claim 1, wherein said first to fourth thin film transistors are N-type thin film transistors, said first reference level end is a high level end, and said second reference level end is a low level end.

3. The electro-static discharge protective circuit according to claim 1, wherein said first to fourth thin film transistors are P-type thin film transistors, said first reference level end is a low level end, and said second reference level end is a high level end.

4. An electro-static discharge protective circuit, comprising:
   a first thin film transistor having a first source electrode connected to a first reference level end, and a first gate electrode and a first drain electrode connected with each other at a first node;
   a second thin film transistor having a second source electrode connected to said first node, and a second gate electrode and a second drain electrode connected with each other at a discharge end;
   a third thin film transistor having a third source electrode connected to said discharge end, and a third gate electrode and a third drain electrode connected with each other at a second node;
   a capacitor having a first end connected to said first node and a second end connected to said second node; and
   a fourth thin film transistor having a fourth source electrode connected to said second node, and a fourth gate electrode and a fourth drain electrode connected to a second reference level end.

5. The electro-static discharge protective circuit according to claim 4, wherein said first to fourth thin film transistors are N-type thin film transistors, said first reference level end is a high level end, and said second reference level end is a low level end.

6. The electro-static discharge protective circuit according to claim 4, wherein said first to fourth thin film transistors are P-type thin film transistors, said first reference level end is a low level end, and said second reference level end is a high level end.

7. A display substrate, comprising:
   an electro-static discharge protective circuit according to claim 1, having the discharge end connected to a signal line in said display substrate.

8. The display substrate according to claim 7, wherein said signal line is a data line.

9. The display substrate according to claim 7, wherein said signal line is a gate line.

10. A display substrate comprising:
    an electro-static discharge protective circuit according to claim 4, having the discharge end connected to a signal line in said display substrate.

11. The display substrate according to claim 10, wherein said signal line is a data line.

12. The display substrate according to claim 10, wherein said signal line is a gate line.

13. A display device comprising a display substrate according to claim 7.

14. A display device comprising a display substrate according to claim 10.

* * * * *